(12) United States Patent
Watford

(10) Patent No.: US 10,794,956 B2
(45) Date of Patent: Oct. 6, 2020

(54) CIRCUIT BREAKER LOCKOUT SUBASSEMBLIES, AND CIRCUIT BREAKERS AND METHODS INCLUDING SAME

(71) Applicant: Siemens Industry, Inc., Alpharetta, GA (US)

(72) Inventor: Russell Thomas Watford, Lawrenceville, GA (US)

(73) Assignee: Siemens Industry, Inc., Alpharetta, GA (US)

( * ) Notice: Subject to any disclaimer, the term of this patent is extended or adjusted under 35 U.S.C. 154(b) by 771 days.

(21) Appl. No.: 15/589,297

(22) Filed: May 8, 2017

(65) Prior Publication Data

US 2018/0323600 A1 Nov. 8, 2018

(51) Int. Cl.
*H02H 3/05* (2006.01)
*H02H 1/00* (2006.01)
*G01R 31/333* (2006.01)
*H01H 71/52* (2006.01)
*H01H 71/10* (2006.01)
*H01H 71/08* (2006.01)

(52) U.S. Cl.
CPC ....... *G01R 31/3333* (2013.01); *H01H 71/082* (2013.01); *H01H 71/1027* (2013.01); *H01H 71/52* (2013.01)

(58) Field of Classification Search
CPC ............. G01R 31/3333; H01H 71/082; H01H 71/1027; H01H 71/52
USPC ............................. 335/14, 21, 26, 28, 32, 34
See application file for complete search history.

(56) References Cited

U.S. PATENT DOCUMENTS

| | | | | |
|---|---|---|---|---|
| 4,001,739 | A * | 1/1977 | Powell | H01H 71/46 335/34 |
| 5,909,161 | A * | 6/1999 | DiMarco | H01H 71/505 335/10 |
| 7,864,003 | B2 | 1/2011 | Yang | |
| 8,159,318 | B2 * | 4/2012 | Yang | H01H 71/123 335/18 |
| 8,476,992 | B2 | 7/2013 | Yang et al. | |
| 8,836,453 | B2 * | 9/2014 | Yang | H01H 9/20 335/167 |
| 9,570,262 | B1 | 2/2017 | Thomas et al. | |
| 9,685,293 | B1 * | 6/2017 | Watford | H01H 71/1054 |

(Continued)

OTHER PUBLICATIONS

Thomas, Stephen Scott; United States Patent Application titled: Linkage-Based Off-Stop Apparatus and Methods for Circuit Breakers with U.S. Appl. No. 15/225,935, filed Aug. 2, 2016.

*Primary Examiner* — Bernard Rojas

(57) ABSTRACT

A lockout subassembly of an electronic circuit breaker. The lockout subassembly includes a rotatable latch bar having an engagement portion configured to engage with and prevent movement of an operating handle to an ON position, the rotatable latch bar including a lock portion, and a latch device configured to be receivable in the lock portion, wherein rotation of the rotatable latch bar is limited between a first and second rotational position in response to the latch device being received in the lock portion. The lockout of the operating handle can be removed upon passing at least one test so that the operating handle can be moved to the ON position. Circuit breakers including the lockout subassembly and methods of operating the circuit breaker are provided, as are other aspects.

20 Claims, 14 Drawing Sheets

(56) References Cited

U.S. PATENT DOCUMENTS

| | | |
|---|---|---|
| 2009/0189719 A1 | 7/2009 | Yang |
| 2013/0088310 A1 | 4/2013 | Yang et al. |
| 2014/0251769 A1 | 9/2014 | Chen et al. |
| 2019/0096619 A1* | 3/2019 | Watford ............. H01H 71/2463 |

* cited by examiner

A-A

B-B

C-C

A-A

B-B

C-C

D-D

A-A

B-B

C-C

D-D

A-A

B-B

C-C

D-D

A-A

B-B

C-C

D-D

CIRCUIT BREAKER LOCKOUT SUBASSEMBLIES, AND CIRCUIT BREAKERS AND METHODS INCLUDING SAME

FIELD

Embodiments of the disclosure relate to switches, and more particularly to switches having a lockout feature that prevents an operating handle from moving under certain conditions.

BACKGROUND

Electronic circuit breakers are used in certain electrical systems for protecting or controlling electrical circuits coupled to an electrical power source. Examples of electronic circuit breakers include Arc Fault Circuit Breakers (AFCIs), Ground Fault Circuit Interrupters (GFCIs), Combination Arc Fault Circuit Interrupters (CAFCI), Transient Voltage Surge Suppressors (TVSSs), and surge protectors. These devices detect certain types of faults, such as arc faults, ground faults, or other unwanted electrical conditions, and disconnect a power source from a load circuit in response to a fault detection.

SUMMARY

In a first embodiment, a lockout subassembly is provided. The lockout subassembly includes a rotatable latch bar having an engagement portion configured to engage with and prevent movement of an operating handle to an ON position, the rotatable latch bar including a lock portion, and a latch device configured to be receivable in the lock portion, wherein rotation of the rotatable latch bar is limited between a first rotational position and a second rotational position in response to the latch device being received in the lock portion.

In another embodiment, a circuit breaker including a lockout subassembly is provided. The circuit breaker includes an operating handle movable to a RESET position and to an ON position, electrical contacts being in a closed state in response to the operating handle being in the ON position and being in an open state in response to the operating handle being in the RESET position, electronic circuitry configured to perform at least one test in response to the operating handle moving to the RESET position and indicating a pass or fail of the at least one test, and a lockout subassembly having a locked state configured to prevent the operating handle from moving to the ON position in response to the at least one test indicating a fail and having an unlocked state configured to enable the operating handle to move to the ON position in response to the at least one test indicating a pass.

In another embodiment, a method of operating a circuit breaker is provided. The method includes detecting movement of an operating handle toward a RESET position, performing at least one test in response to the operating handle moving toward the RESET position, preventing the operating handle from moving to an ON position in response to the at least one test indicating a fail, and enabling the operating handle to move to the ON position in response to the at least one test indicating a pass.

Other features and aspects of the present disclosure will become more fully apparent from the following detailed description, the appended claims, and the accompanying drawings.

BRIEF DESCRIPTION OF THE FIGURES

The drawings, described below, are for illustrative purposes only, and are not restrictive. The drawings are not necessarily drawn to scale and are not intended to limit the scope of this disclosure in any way.

DETAILED DESCRIPTION

Figure 1:
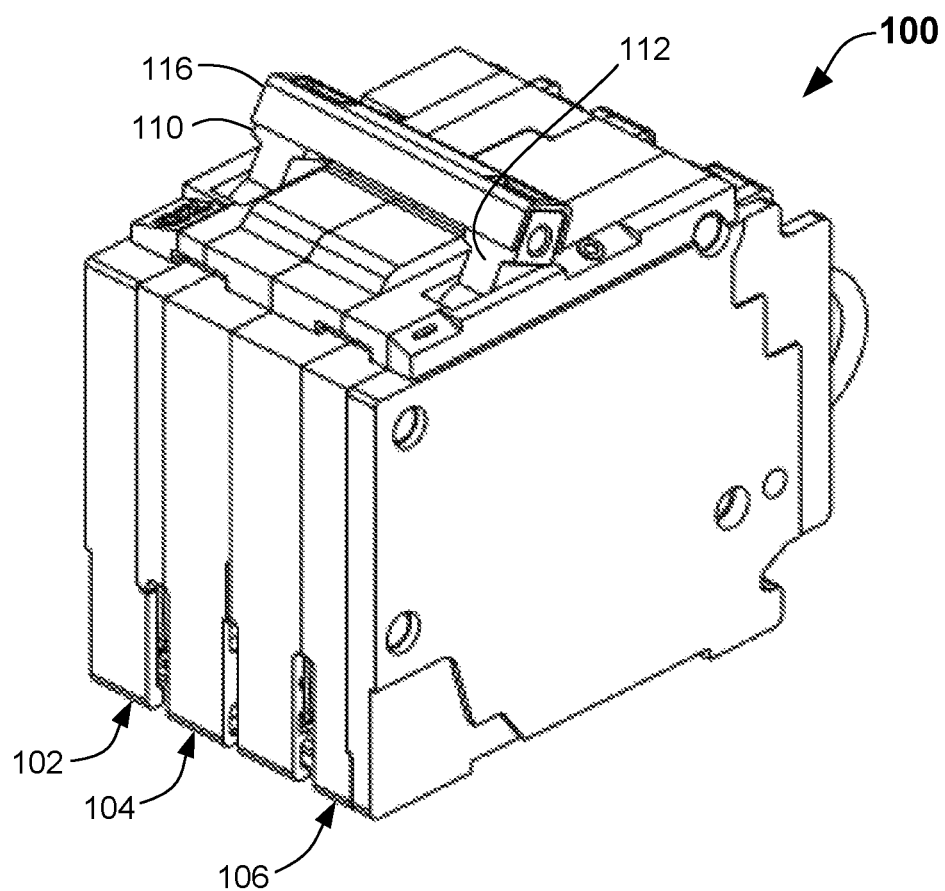
FIG. 1 illustrates an isometric view of a two-pole electronic circuit breaker including a lockout subassembly according to embodiments.

Electronic circuit breakers are devices that are electrically coupled in series with a line and a load and function to prevent overcurrent and other fault conditions from damaging the line, the load, and/or devices coupled between the line and the load. An electronic circuit breaker has a moveable operating handle mechanically coupled to electrical contacts that electrically couple the line and the load. The electrical contacts open or trip in response overcurrent and other fault conditions to prevent excessive current from being drawn by the load. Under normal operation, the moveable operating handle is positioned in an ON position and the electronic circuit breaker is referred to as being in an ON state. During the ON state, the electrical contacts are closed to allow current to flow between the line and the load. When an overcurrent condition or other fault is detected, the electronic circuit breaker trips and enters a TRIP state which opens the electrical contacts to prevent current flow between the line and the load. Tripping may be by activation of a thermal-magnetic element or by sensing and activating tripping via a signal from the electronics of the electronic circuit breaker. When the electronic circuit breaker is in the TRIP state, the moveable operating handle is positioned in a TRIP position.

In order to return the electronic circuit breaker from the TRIP state to the ON state, a user manually moves the moveable operating handle from the TRIP position, to a RESET position, and back to the ON position. The electrical contacts are open when the moveable operating handle is in the RESET position and they are forced closed when the moveable operating handle is moved to the ON position. The electrical contacts remain closed so long as the moveable operating handle is in the ON position, even if a user manually holds the moveable handle in the ON position during conditions when the electronic circuit breaker would otherwise enter the TRIP state. If the fault condition that caused the electronic circuit breaker to enter the TRIP state has not been rectified, then the fault condition will continue to be present during the period that the user manually holds the moveable handle in the ON position in prior art electronic circuit breakers.

In view of the foregoing difficulties, a lockout subassembly of an electronic circuit breaker is provided that includes a latch device and a rotatable latch bar configured to allow locking and unlocking of a moveable operating handle. The moveable operating handle may be implemented in devices such as electronic circuit breakers, but may be equality applicable to other electronic switching apparatus. In particular, the lockout subassembly operates to lock the moveable operating handle as it is moved toward the ON position, so to prevent the moveable operating handle from moving to the ON position unless at least one test criterion is met. For example, the lockout subassembly may prevent the moveable operating handle from moving to the ON position in response to a detection of a low resistance condition on the load circuit, which would draw excessive current.

The lockout subassembly described herein is implemented within an electronic circuit breaker. The electronic circuit breaker includes main electrical contacts or main switches mechanically coupled to a movable operating handle and a secondary switch. According to one aspect, closing of the secondary switch is accomplished when the moveable operating handle is moved to the RESET position. The closing of the secondary switch may be used to initiate powering of internal electronic test circuitry, such as electronic circuitry on a printed circuit board (PCB) of the electronic circuit breaker. Once the electronic test circuitry is powered, at least one test may be performed by the electronic test circuitry while the moveable operating handle remains in the locked state by operation of the lockout subassembly and the main contacts remain open. If the at least one test indicates a pass, then the moveable operating handle may be unlocked by disengaging the lockout subassembly from the moveable operating handle. This unlocking enables the moveable operating handle to be moved by a user to the ON position, so that the main electrical contacts may be closed. In contrast, if the at least one test fails, the electronic circuit breaker is determined to have a failed internal electronic circuit and/or a fault condition exists between the line and the load, and the lockout subassembly will remain in a locked state. The moveable operating handle is prevented from moving to the ON position when the lockout subassembly is in the locked state, thus providing the user a tactile feel and indication that something is wrong.

The embodiments of lockout subassemblies described herein are implemented in two-pole electronic circuit breakers. However, the implementation of the lockout subassemblies described herein are not limited to the illustrative examples for two-pole electronic circuit breakers described herein, but are equally applicable to other types of electronic circuit breakers and electronic switching devices. For example, embodiments of the disclosure described herein may be implemented in other circuit breakers, such as single-pole electronic circuit breakers, surge protective devices such as transient voltage surge protection (TVSS) devices, metering electronic circuit breakers, electronic trip unit circuit breakers, and remotely controllable electronic circuit breakers, for example. Other types of electronic circuit breakers including self-testing circuitry and single or multiple electrical branches may benefit as well.

These and other embodiments of lockout subassemblies, electronic circuit breakers including a lockout subassembly, methods of operating the lockout subassembly and methods of operating the electronic circuit breakers including the lockout subassembly are described below with reference to FIGS. 1-15. Reference will now be made in detail to the example embodiments, which are illustrated in the accompanying drawings. Wherever possible, the same reference numbers will be used throughout the drawings to refer to the same or like parts.

Referring now in specific detail to FIG. 1, an electronic circuit breaker 100 is shown. The electronic circuit breaker 100 will be referred to herein as "electronic circuit breaker" or just "circuit breaker." The electronic circuit breaker 100 depicted herein is a two-pole electronic circuit breaker that includes three modules, which are referenced individually as a first module 102, a second module 104, and a third module 106. The first module 102 and the third module 106 are configured to electrically couple in series between individual lines and loads. For example, the first module 102 may be configured to be electrically coupled between a first line and a first load operating at a first phase. The third module 106 may be configured to be electrically coupled between a second line and a second load operating at a second phase. In such an example, the electronic circuit breaker 100 may provide protection to a 220V circuit operating at 110V on the first line and 110V on the second line.

The second module 104 includes electronic circuitry that monitors the first line and first load and the second line and second load for faults, and trips the electronic circuit breaker 100 if certain fault conditions are met, such as a ground or arc fault. As described in greater detail herein, the electronic circuitry is also configured to enable a test of the first line and first load and the second line and second load and not release a lockout subassembly (not shown in FIG. 1) unless the detected fault has been removed. The electronic circuit breaker 100 is described with the second module 104 located between the first module 102 and the third module 106. In other embodiments, the locations of the first module 102 and the second module 104 may be switched. In yet other embodiments, the locations of the second module 104 and the third module 106 may be switched.

The first module 102 has a moveable operating handle 110 and the third module 106 has a moveable operating handle 112. The moveable operating handle 110 and the moveable operating handle 112 will be referred to individually herein as "moveable handle," "operating handle," or just "handle." The handles 110, 112 may be in one of four positions, ON, OFF, RESET, and TRIP. The ON position is manually achieved by a user moving the handles 110, 112 from another position to the ON position. The electronic circuit breaker 100 is referred to as being in an ON state when the handles 110, 112 are in the ON positions. When the electronic circuit breaker 100 is in the ON state, the first module 102 and the third module 106 (comprising the electrical contacts) enable current flow between the first line and first load and the second line and second load. The electronic circuit breaker 100 prevents current flow between the first line and first load and the second line and second load in all other positions of the handles 110, 112.

An OFF position of the handles 110, 112 and an associated OFF state of the electronic circuit breaker 100 occurs in response to a user manually moving the handles 110, 112 to an OFF position. A TRIP position of the handles 110, 112 and an associated TRIP state of the electronic circuit breaker 100 occurs by an automated process within the electronic circuit breaker 100 in response to a fault detection. For example, a fault detection (e.g., a short, a low level persistent overcurrent, an arc fault, a ground fault, or the like) will cause the electronic circuit breaker 100 to transition from the ON state to the TRIP state. A RESET position of the handles 110, 112 and an associated RESET state of the electronic circuit breaker 100 occurs when a user manually moves the handles 110, 112 to the RESET position.

The handle 110 and the handle 112 may be mechanically connected together by a bar 116, so that the handles 110, 112 are always in the same position. Accordingly, the first module 102 and the third module 106 may always be in the same state. After the electronic circuit breaker 100 enters the TRIP configuration, a user may move the handles 110, 112 to the RESET position, which may initialize the electronic circuitry within the second module 104 to perform at least one test. If the results of the at least one test indicate a pass, then there are no faults detected in either the first line, first load, second line, or second load, and possibly also, the test may verify that the electronic circuit breaker 100 is functioning properly. Upon passing the at least one test, a lockout subassembly (not shown in FIG. 1) releases (e.g., via actuation of an actuator) and enables the handles 110, 112 to be moved to the ON position. To the contrary, if the results of the at least one test indicate a failure, then there may be at least one fault in the electronic circuit breaker 100 and/or at least one fault within the first line, first load, second line, or second load. Upon failure indicated by the at least one test, the lockout subassembly prevents the handles 110, 112 from moving to the ON position.

Figure 2:
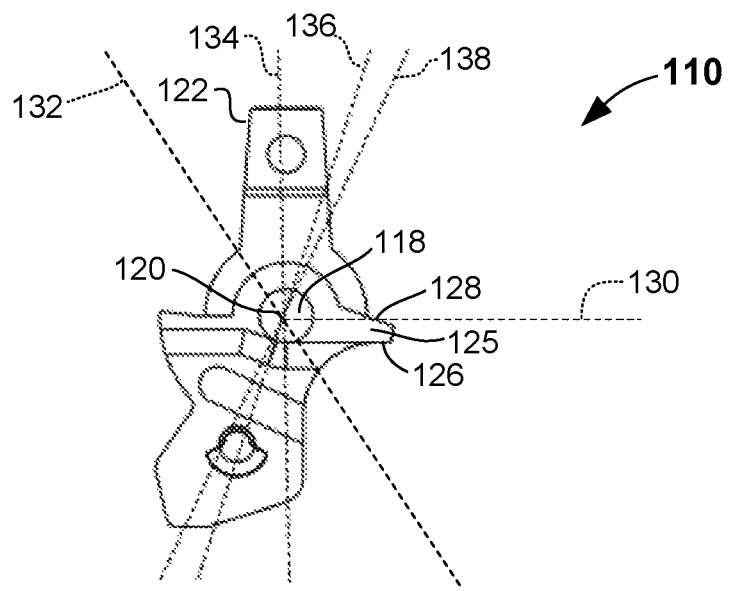
FIG. 2 illustrates a side view of a moveable handle of an electronic circuit breaker with dashed lines illustrating different positions of the moveable handle according to embodiments.

Reference is now made to FIG. 2, which illustrates a side view of an embodiment of the handle 110 with dashed lines illustrating different positions of the handle 110 relative to a reference plane 130. The reference plane 130 may be, for example, a top surface of the electronic circuit breaker 100 (FIG. 1) proximate the handle 110, or another suitable datum. The handle 112 (FIG. 1) has identical handle positions and the following description is applicable to the handle 112. The handle 110 may include a hole 118 through which a support member (not shown in FIG. 2) may pass. The support member enables the handle 110 to rotate about an axis 120 centered in the hole 118. Other suitable structures for allowing the handle 110 to rotate about the axis 120 within a molded case of the electronic circuit breaker 100 may be used. A user may contact an end 122 of the handle 110 to physically pivot or rotate the handle 110 to the above-described positions about the axis 120. The position of the handle 110 provides visual and tactile indications to a user regarding the state of the electronic circuit breaker 100.

During normal operation of the electronic circuit breaker 100, the handle 110 is positioned in the ON position as shown by a dashed line 132. In this position, the electrical contacts are closed. In response to the electronic circuit breaker entering a TRIP state, the handle 110 rotates about the axis 120 in a clockwise direction as viewed from FIG. 2, so that the end 122 is positioned as depicted by the line 134. The handle 110 may then be rotated so the end 122 is in the OFF position, as depicted by the line 136, by a user manually moving the handle 110 to place the electronic circuit breaker in the OFF state. A user moves the end 122 to the RESET position, as depicted by the line 138, to place the electronic circuit breaker 100 in the RESET state. The RESET position of the handle 110 may be achieved by the user moving the end 122 as far as possible in the clockwise direction as viewed from FIG. 2. Movement of the end 122 to the OFF position, as depicted by the line 136, may be accomplished by a return spring (not shown) moving the handle 110 from the RESET position to the OFF position.

At least one test may be performed by the second module 104 (FIG. 1) in response to the handle 110 being positioned in the RESET position. The handle 110 is enabled to move to the ON position in response to the at least one test indicating a pass, as described above, and operation of the lockout subassembly as described herein. The handle 110 is prevented by the lockout subassembly from moving to the ON position in response to the at least one test indicating a failure as described above.

In one or more embodiments, the handle 110 may include a lock member 125 having a first contact surface 126 that is configured to contact a portion of a latch bar (not shown in FIG. 2) to initiate the at least one test in response to the handle 110 moving to the RESET position. The handle 110 further includes a second contact surface 128 that is configured to contact a portion of the latch bar to prevent the handle 110 from moving to the ON position in response to failure of the at least one test.

Figure 3A:
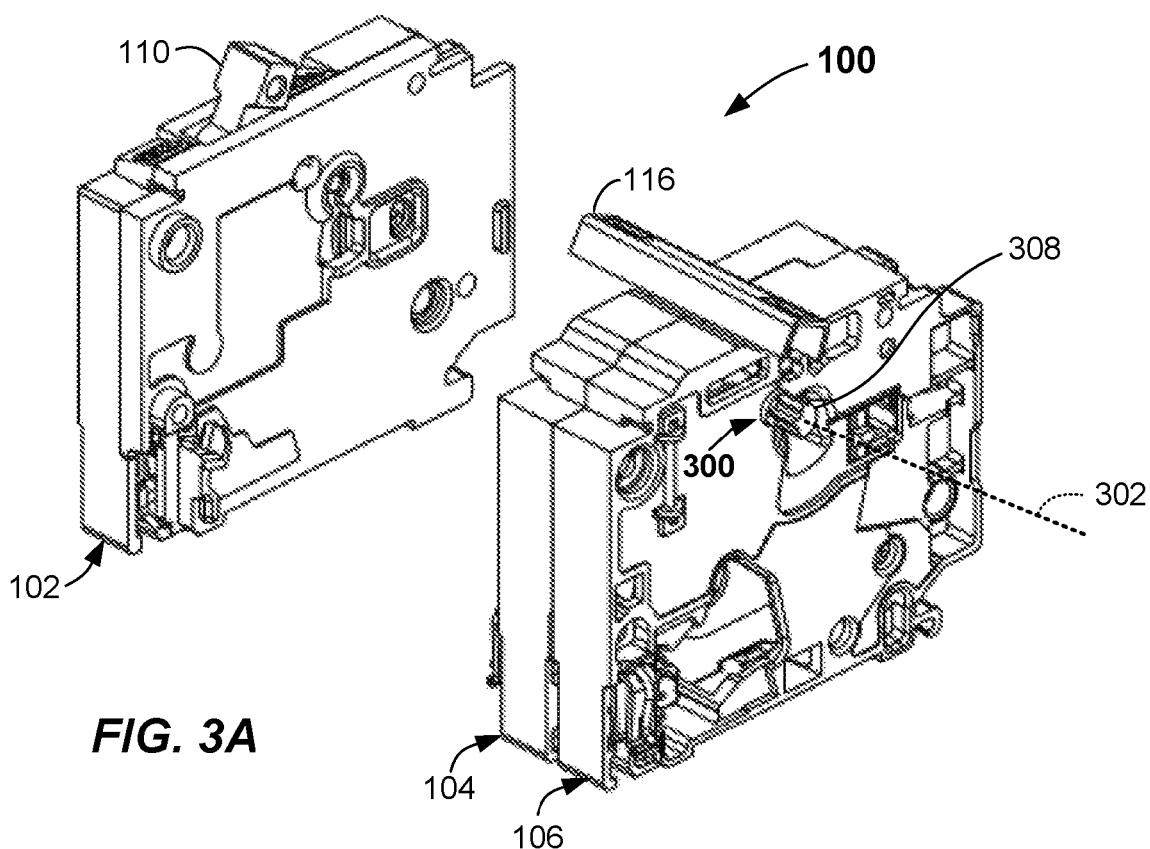
FIG. 3A illustrates an exploded isometric view of an electronic circuit breaker with a first module separated and a side of a third module removed to show portions of a lockout subassembly according to embodiments.

Reference is now made to FIG. 3A, which illustrates the electronic circuit breaker 100 with the first module 102 separated and a side of the third module 106 removed to illustrate devices located within the second module 104.

Figure 3B:
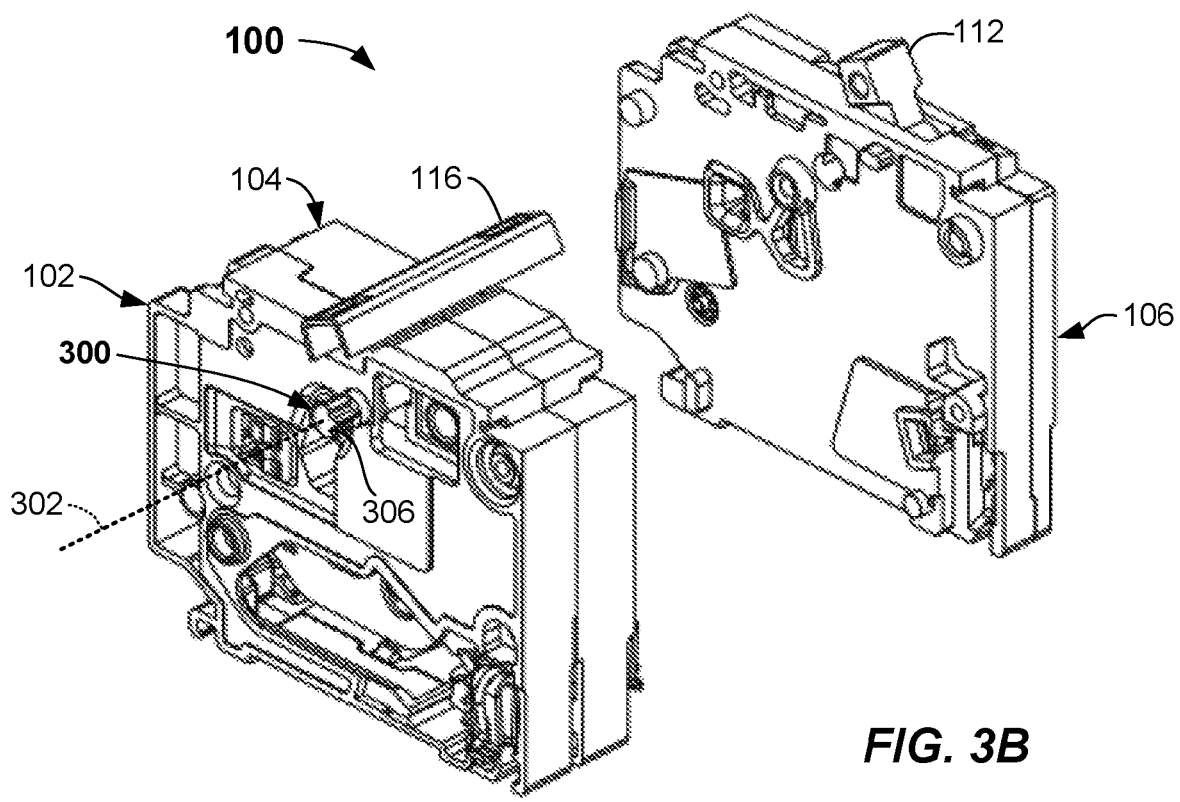
FIG. 3B illustrates an exploded isometric view of an electronic circuit breaker with a third module separated and a side of a first module removed to show portions of a lockout subassembly according to embodiments.

Additional reference is made to FIG. 3B, which illustrates the electronic circuit breaker 100 with the third module 106 separated and a side of the first module 102 removed to illustrate devices located within the second module 104. Some electrical and mechanical devices have been removed from the views of the first module 102 and the third module 106 to illustrate a lockout operation of the electronic circuit breaker 100.

A latch bar 300 is located within the second module 104 and, in the two-pole embodiment, at least partially extends into both the first module 102 and the third module 106. The latch bar 300 is rotatable about an axis 302 and may be supported for rotation within the electronic circuit breaker 100 by bearings or the like (not shown) that enable the latch bar 300 to rotate about the axis 302. A first end 306 of the latch bar 300 is engageable with and extends into the first module 102 and a second end 308 of the latch bar 300 is engageable with and extends into the third module 106. As described in greater detail herein, the latch bar 300 constitutes a component of the lockout subassembly, which functions to prevent or enable movement of the handles 110, 112 to the ON position, and may also activate the electronic circuitry (not shown in FIGS. 3A and 3B) that performs the at least one test.

Figure 4A:
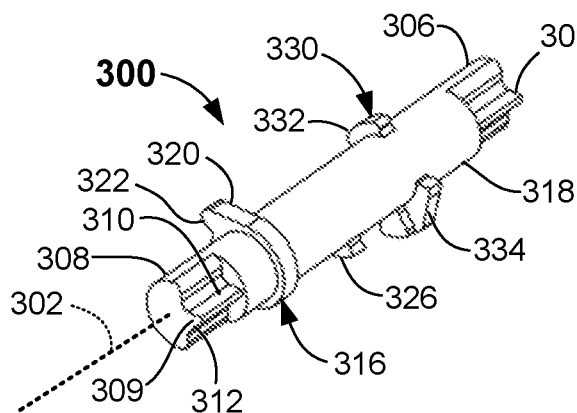
FIGS. 4A and 4B illustrate isometric views of a latch bar having a plurality of features according to embodiments.
Figure 4B:
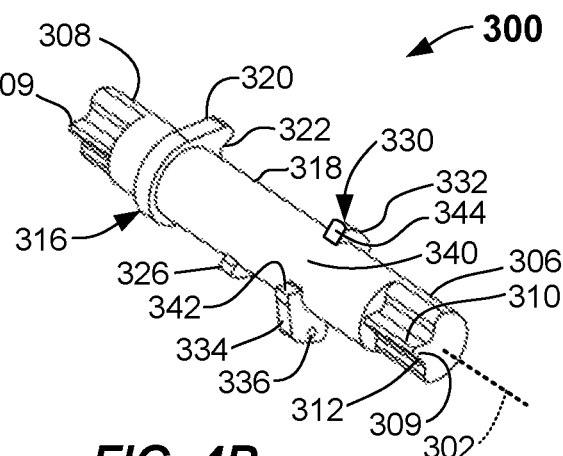
Figure 4C:
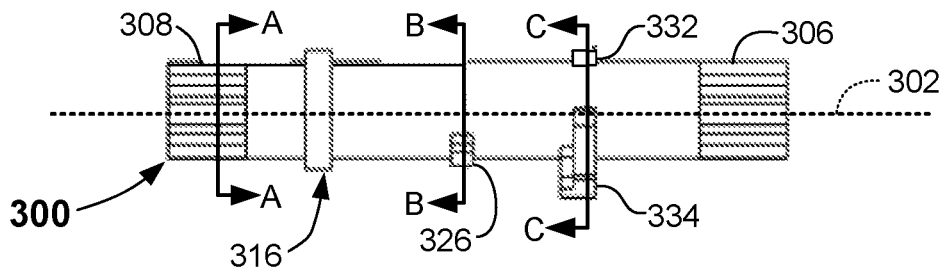
FIG. 4C illustrates a side elevation view of a latch bar having a plurality of features according to embodiments.
Figure 4D:
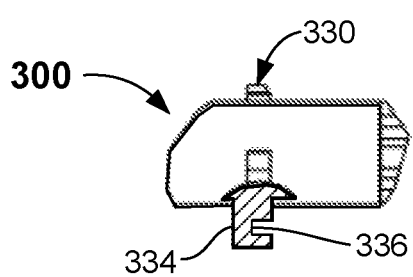
FIG. 4D illustrates a partial side view a latch bar having a recess to receive a portion of a spring according to embodiments.
Figure 4E:
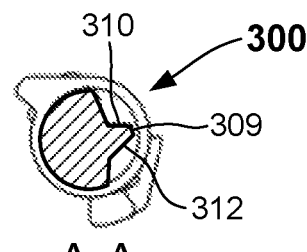
FIGS. 4E-4G illustrate different cross-sectional views through features of a latch bar according to embodiments.
Figure 4F:
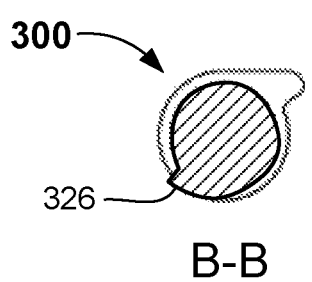
Figure 4G:
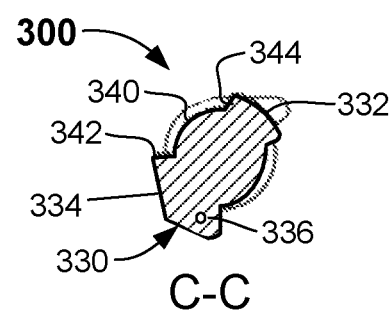

Reference is made to FIGS. 4A-4G, which illustrate different views of an embodiment of the latch bar 300. Specifically, FIGS. 4A and 4B illustrate isometric views of an embodiment of the latch bar 300. FIG. 4C illustrates a side elevation view of the latch bar 300 and FIG. 4D illustrates a partial side elevation view of the latch bar 300. FIGS. 4E-4G illustrate different cross-sectional end views of the latch bar 300 illustrating various features thereof. The latch bar 300 may be made of suitable rigid materials such as thermoplastic nylon 6/6, mineral-filled Phenolic materials, various metals, and the like.

The first end 306 and the second end 308 of the latch bar 300 each have engagement portions 309 that engage the lock member 125 (FIG. 2) of each of the handles 110, 112. The cross-section along section line A-A shown in FIG. 4E illustrates a cross-sectional view of the engagement portion 309. Each engagement portion 309 may have a first contact surface 310 that is configured to be contactable with the first contact surface 126 (FIG. 2) of either of the handles 110, 112 during movement of the handles 110, 112 to the RESET position. A second contact surface 312 may be configured to be contactable with the second contact surface 128 (FIG. 2) of the handles 110, 112 in response to the electronic circuit breaker 100 (FIG. 1) being in a locked state. As described herein, the locked state prevents the handles 110, 112 from moving to the ON position.

The latch bar 300 may include a feature 316 that extends radially from a body 318 of the latch bar 300. The feature 316 may include an extension 320 having a surface 322 located thereon. The feature 316 may function to maintain the latch bar 300 within a specific portion of the electronic circuit breaker 100. Specifically, the second end 308 of the latch bar 300 may extend through an opening in a molded case of the second module 104 that is sized to receive the second end 308, but is too small to receive the feature 316. Accordingly, the latch bar 300 is retained within the electronic circuit breaker 100 at least in part by the feature 316. The surface 322 may be configured to contact a return spring (not shown in FIGS. 4A-4G) to bias the latch bar 300 to a specific rotational position as described in greater detail below.

A cam 326 may extend from the body 318 of the latch bar 300 and may function to change the state of a switch (not shown in FIGS. 4A-4G) that is electrically coupled to the electronic circuitry described above. The cross-sectional view along section line B-B of FIG. 4F illustrates a view of the cam 326. In summary, when the handles 110, 112 move to the RESET position, their movement causes the latch bar 300 to rotate about the axis 302 to a rotational position where the cam 326 contacts the switch. The contact may depress the switch to cause a state change of the switch, which initiates the electronic circuitry to perform the at least one test.

A lock portion 330 is formed on, and may extend from, the body 318 and may include a first portion 332 and a second portion 334. Cross-section along section line C-C of FIG. 4G illustrates a view of the lock portion 330. The second portion 334 may include a recess 336 that is sized to receive an end of a torsion spring (not shown in FIGS. 4A-4G) that functions to bias the latch bar 300 in a predetermined rotational direction about the axis 302. Other means for spring biasing the latch bar 300 may be used. The lock portion 330 forms a gap 340, which may be bounded by wall 342 and wall 344. The gap 340 functions to receive at least a portion of a latch device (See latch device 524 in FIG. 6A-6C). The gap 340 functions as a lock portion of the latch bar 300. When a portion of the latch device 524 is received in the gap 340, the rotation of the latch bar 300 is limited by the wall 342 and the wall 344 as described in greater detail below. For example, the rotational limitation of the latch bar 300 may enable the handle 110 (FIG. 2) to rotate or move to the RESET position, but not to the ON position, until the latch device 524 is released from the gap 340. In some examples, the gap 340 may encompass between about 45 degrees and 140 degrees. Other sizes of gap 340 may be used.

Figure 5:
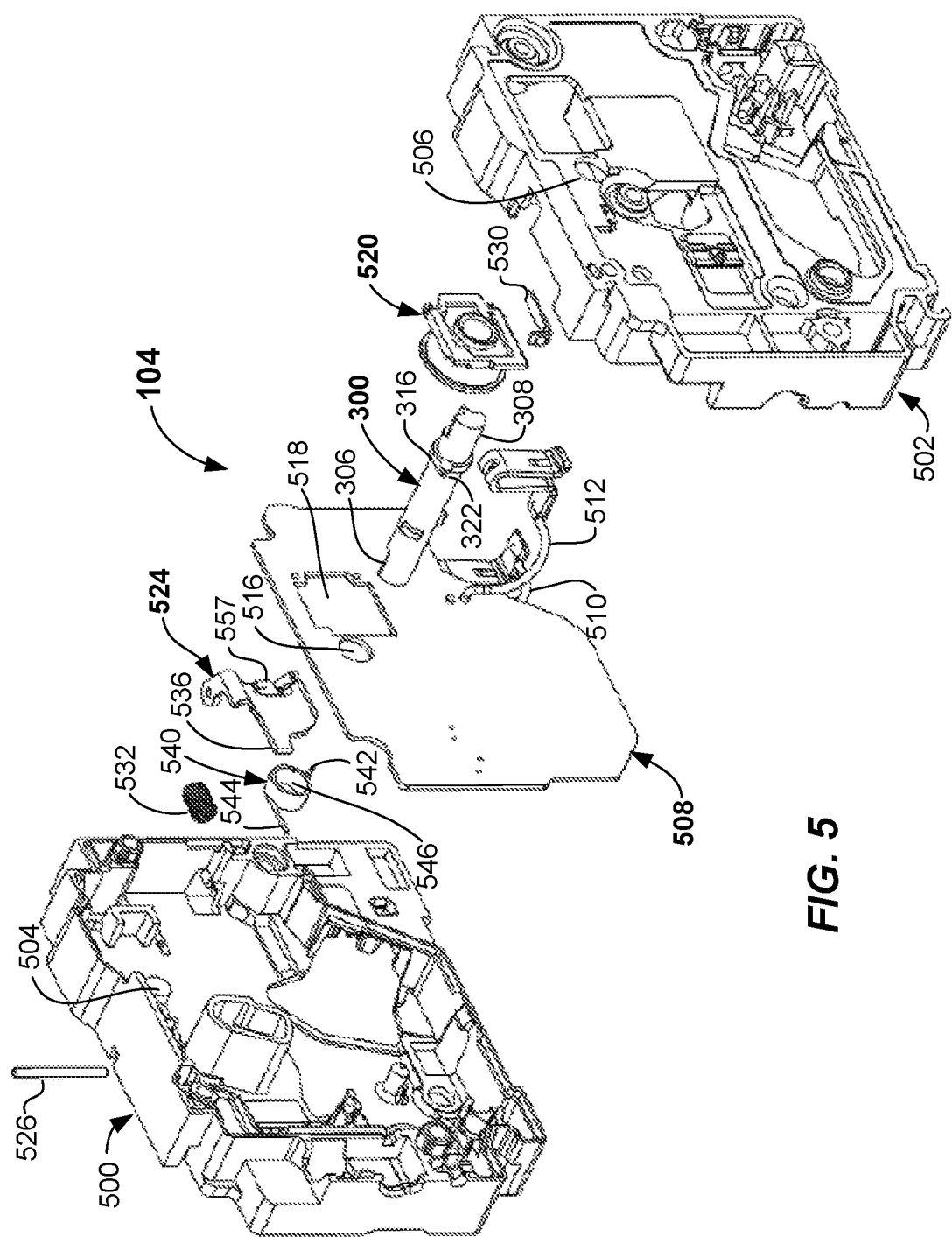
FIG. 5 illustrates an exploded isometric view of an embodiment of a second module of an electronic circuit breaker including components of a lockout subassembly according to embodiments.

FIG. 5 illustrates an exploded isometric view of an embodiment of the second module 104 of the electronic circuit breaker 100 (FIG. 1). The second module 104 includes a first body portion 500 and a second body portion 502 that couple together to form a complete body portion of the second module 104. The first body portion 500 and the second body portion 502 may be made of the same materials as described above. The exploded view of FIG. 5 illustrates an embodiment showing the interior of the first body portion 500, which includes many features for securing devices associated with the latch bar 300 within the second module 104. For example, the first body portion 500 may include a first hole 504 that is configured to receive the first end 306 of the latch bar 300 and enables the latch bar 300 to rotate within the first hole 504 and the first body portion 500. In a similar manner, the second body portion 502 may include a second hole 506 that receives the second end 308 of the latch bar 300 and enables the latch bar 300 to rotate within the second hole 506 and the second body portion 502. The first hole 504 may be further configured as a through hole that enables the first end 306 of the latch bar 300 to extend through the first body portion 500 into the first module 102 (FIG. 1). The second hole 506 may be further configured as a through hole that enables the second end 308 to extend through the second body portion 502 and into the third module 106 (FIG. 1).

A printed circuit board (PCB) 508 may be located between the first body portion 500 and the second body portion 502. The PCB 508 includes electronic circuitry (not shown in FIG. 5) that performs the at least one test described above. The electronic circuitry may be coupled to a power source that functions to supply power (not shown) to the electronic circuitry. In the embodiment of FIG. 5, the power may be supplied by a first conductor 510 and a second conductor 512 coupled between the line and a neutral conductor of the electronic circuit breaker 100 to provide power to the electronic circuitry regardless of the state of the electronic circuit breaker 100.

The PCB 508 may include a hole 516 sized and configured to receive the latch bar 300 there through. Specifically, the hole 516 may be configured so that the latch bar 300 may rotate within the hole 516. The PCB 508 may also include a hole 518 that is sized and configured to receive an electromagnetic device, such as an electromagnet 520 or a portion of the electromagnet 520. The electromagnet 520 may be mechanically and/or electrically coupled to the PCB 508 and may be activated by the electronic circuitry located on the PCB 508. The electromagnet 520 functions to electromagnetically move the latch device 524 as described in greater detail below. The PCB 508 may further include a switch 610 (FIG. 6) electrically and/or mechanically coupled thereto. The switch 610 changes state by contact with the cam 326 (FIGS. 4A and 4B) of the latch bar 300 so as to cause the electronic circuitry to perform the at least one test. The switch 610 may be a micro switch or a tactile switch, for example. Other types of switches may be used.

The latch device 524 constitutes a component of the lockout subassembly and may be configured to pivot, such as about a pin 526 secured within the second module 104. The latch device 524 may be biased toward a locked position by a compression spring 532. The electromagnet 520 generates a magnetic field that may force the latch device 524 to pivot to an unlocked position against the bias of the compression spring 532 when the electromagnet 520 is activated. The electromagnet 520 or any other suitable magnetic device may be used to generate a magnetic field to attract and move a portion of the latch device 524 so that the latch device 524 is not engaged with the lock portion 330 (FIG. 4B). The latch device 524 may include a tab 536 that is receivable in the gap 340 (FIG. 4B) of the latch bar 300 when the latch device 524 is in the locked position. In the locked position, the handles 110, 112 cannot be moved to the ON position.

A return spring 530 may be located within the second module 104 and may be contactable with the surface 322 of the feature 316 located on the latch bar 300, as described in greater detail below. A torsion spring 540 may be located within the second module 104 and may include a first spring end 542, a second spring end 544, and a center hole 546. The first end 306 of the latch bar 300 may be received within the center hole 546 and the first spring end 542 may be received within the recess 336 (FIGS. 4D and 4G) of the lock portion 330. The second spring end 544 may be located within the first body portion 500 so as to remain in a fixed position during rotation of the latch bar 300. The fixed position enables the torsion spring 540 to bias the rotation of the latch bar 300 in a predetermined rotational direction. The torsion spring may exert between about 0.05 and 0.1 inch-pounds (approximately 0.005 and 0.01 newton-meters) of torque on the latch bar 300. Other spring rates and means for biasing the latch bar 300 may be used.

Figure 6A:
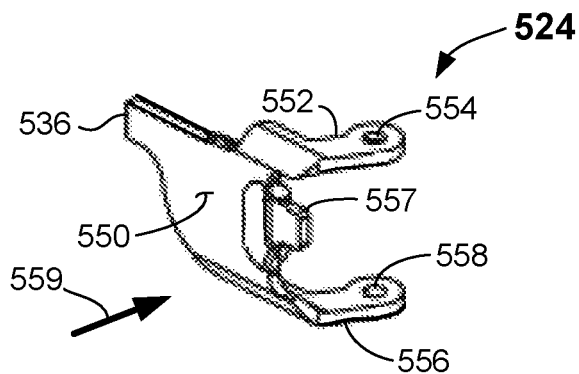
FIG. 6A illustrates an isometric view of an embodiment of a latch device configured to engage with a portion of a latch bar (not shown in FIG. 6A) according to embodiments.
Figure 6B:
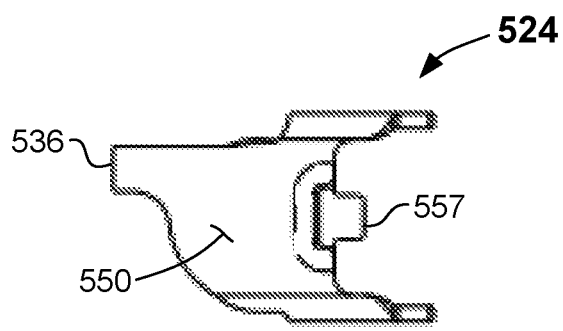
FIG. 6B illustrates a top plan view of an embodiment of a latch device according to embodiments.
Figure 6C:
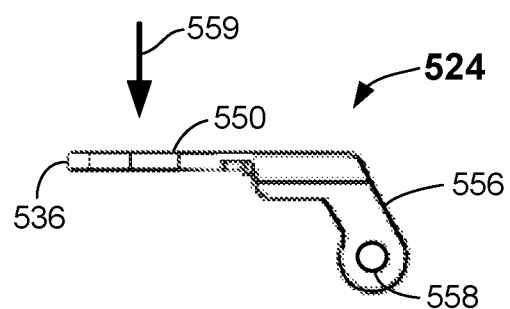
FIG. 6C illustrate a side elevation view of an embodiment of a latch device according to embodiments.

Reference is now made to FIGS. 6A-6C, which illustrate various views of the latch device 524. The latch device 524 may be made of a rigid material, such as a metal (e.g., stainless steel or cold rolled steel). The latch device 524 may have a surface 550 from which the tab 536 may extend. A first leg 552 having a first bore 554 and a second leg 556 having a second bore 558 may extend from the surface 550. The first bore 554 and the second bore 558 may receive the pin 526 (FIG. 5) so as to enable the latch device 524 to pivot about a rotational axis formed along the pin 526. At least a portion of the latch device 524, such as the surface 550, may be made of or include a magnetic material that may be magnetically attracted to the electromagnet 520 (FIG. 5) when the electromagnet 520 is activated.

The latch device 524 may include a spring tab 557 that is configured to receive and retain the compression spring 532 (FIG. 5). The compression spring 532 exerts a force at the spring tab 557 to bias the tab 536 in a direction 559, which constitutes the locked position of the latch device 524. The compression spring 532 may exert approximately 0.2 to 0.5 pounds (approximately 0.89 N to 2.22 N) of force on the spring tab 557. Other exerted forces are possible. In operation, the electromagnet 520 (FIG. 5) exerts an attractive magnetic force on the surface 550 in a direction opposite the direction 559 so as to overcome the force exerted by the compression spring 532 and any mechanism friction. The force exerted by the electromagnet 520 on the surface 550 causes the latch device 524 to pivot about the pin 526 in a direction opposite the direction 559. This position of the latch device 524 is the unlocked position of the latch device 524. Accordingly, the force exerted by the compression spring 532 at the spring tab 557 and mechanism friction is small enough to be overcome by the magnetic force exerted by the electromagnet 520.

Figure 7:
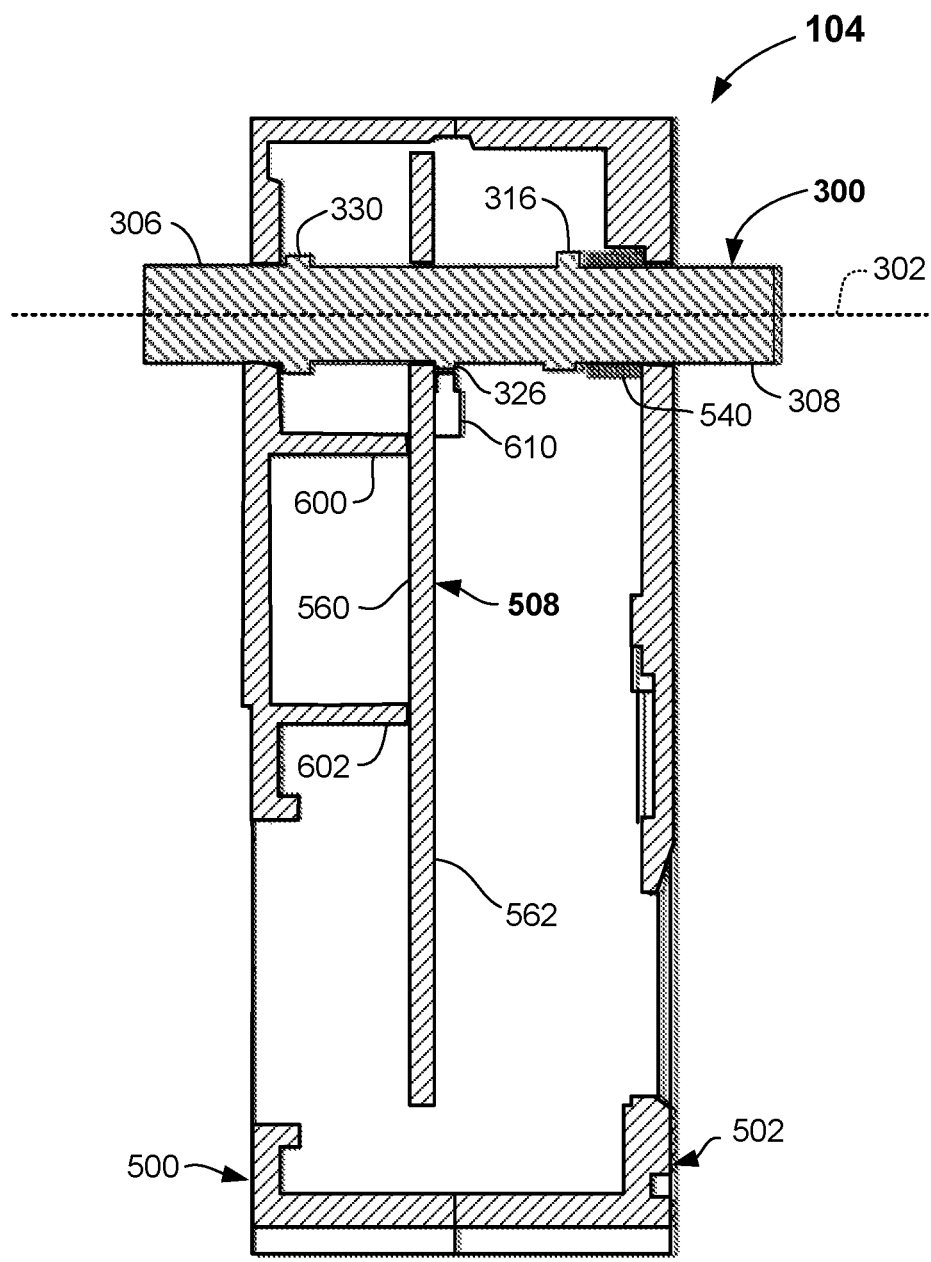
FIG. 7 illustrates a partial cross-sectional side view of a second module of an electronic circuit breaker with a lockout subassembly therein according to embodiments.

Having described many individual components within the second module 104 (FIG. 5) the components will now be described together. Reference is made to FIG. 7, which is a side cross-sectional view of the second module 104. The PCB 508 is shown having a first side 560 and a second side 562. The above-described electronic circuitry located within the second module 104 may be located on either the first side 560 or the second side 562 or both. A first support member 600 and a second support member 602 may mechanically couple the first side 560 of the PCB 508 to the first body portion 500 of the second module 104. Other securing mechanisms may be implemented to secure the PCB 508 within the second module 104.

The second side 562 of the PCB 508 may include a switch 610 mechanically coupled thereto. The switch 610 may be electrically coupled to the electronic circuitry (not shown) on the PCB 508 and may operate to initiate the above-described at least one test performed by the electronic circuitry. During rotation of the latch bar 300 about the axis 302, the cam 326 contacts the switch 610 resulting in a change of state of the switch 610. This change of state of the switch 610 may operate to initialize the above-described at least one test.

Figure 8:
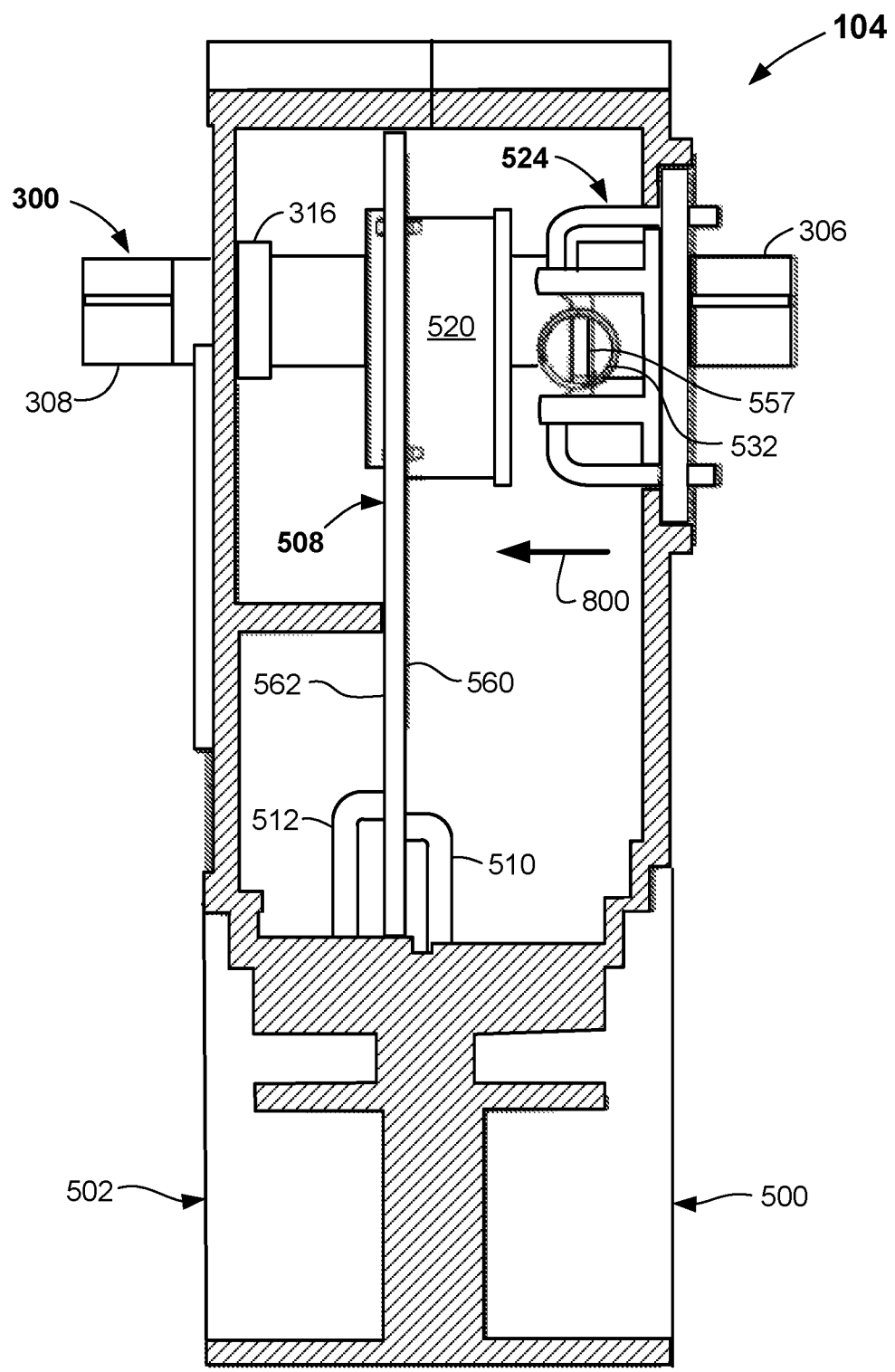
FIG. 8 illustrates a partial cross-sectional side view of a second module of an electronic circuit breaker with a lockout subassembly therein according to embodiments.

FIG. 8 is a partial cross-sectional view of the second module 104 viewed opposite the direction of FIG. 7. As shown in FIG. 8, the electromagnet 520 is shown mechanically coupled to the first side 560 of the PCB 508 and may be located in close proximity to the latch device 524. The close proximity of the electromagnet 520 and the latch device 524 enables the electromagnet 520 to pull on the tab 536 (FIG. 6B) in a direction 800 to an unlocked position when the electromagnet 520 is activated. When the tab 536 is moved in the direction 800, it enables the latch bar 300 to rotate, so the handles 110, 112 (FIG. 1) are no longer locked out and may now be moved to the ON position.

Figure 9:
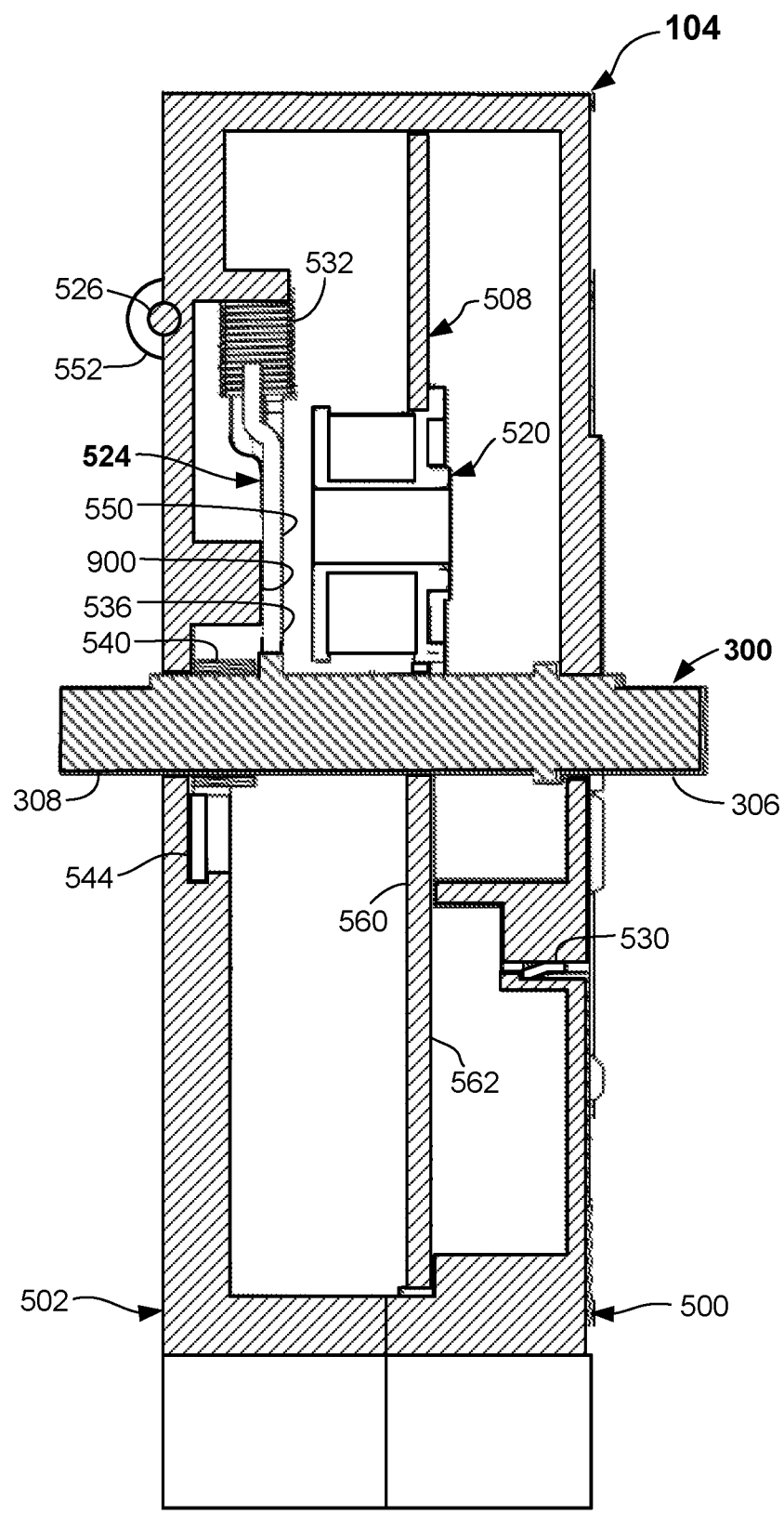
FIG. 9 illustrates a partial cross-sectional top view of a second module of an electronic circuit breaker with a lockout subassembly therein according to embodiments.

FIG. 9 is a partial cross-sectional top view of an embodiment of the second module 104. The latch device 524 may be biased against a ledge 900 in the locked position, so as to be in close proximity to the electromagnet 520. The close proximity of the electromagnet 520 enables the magnetic force generated by the electromagnet 520 to pivot the latch device 524 as described herein. The electromagnet 520 may be within about 1.55 mm of the surface 550, for example.

The return spring 530 is shown secured within the first body portion 500 and may be contactable with the latch bar 300.

Figure 10:
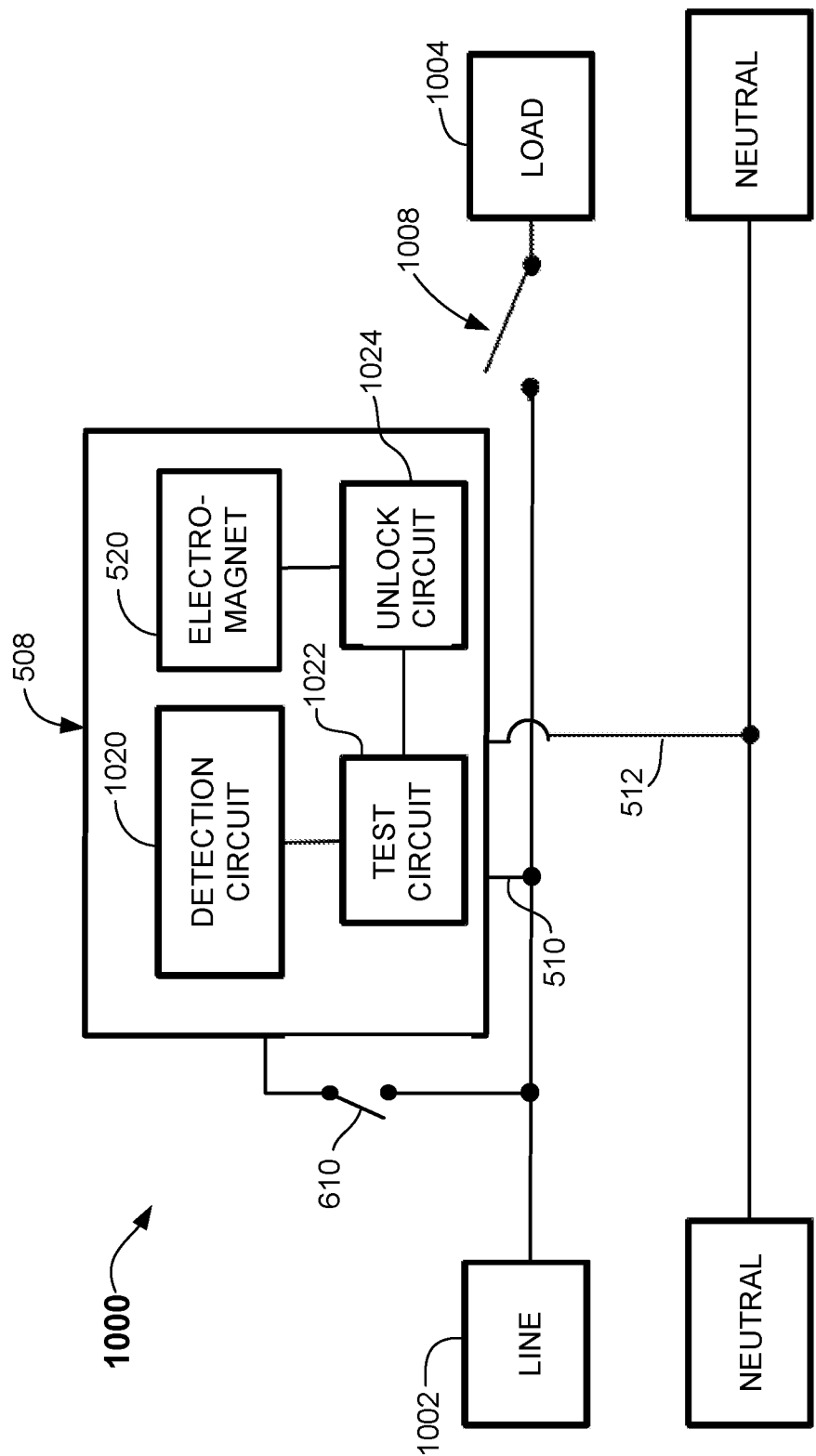
FIG. 10 illustrates a block diagram of an electronic circuit located within an electronic circuit breaker configured to activate a lockout subassembly according to embodiments.

Reference is made to FIG. 10, which illustrates a block diagram of an embodiment of the electronic circuitry 1000 located within the electronic circuit breaker 100 of FIG. 1. The electronic circuitry 1000 may be at least partially located on the PCB 508 (FIG. 5). The electronic circuit breaker 100 is configured to electrically couple a line 1002 to a load 1004 by way of electrical contacts 1008 that are mechanically coupled to the handles 110, 112 (FIG. 1). The electrical contacts 1008 (shown as a switch) are either open or closed depending on the position of the handles 110, 112 as described herein. Specifically, the electrical contacts 1008 are closed when the handles 110, 112 are in the ON position and the electrical contacts 1008 are open when the handles 110, 112 are in all other positions.

The PCB 508 may be electrically coupled to the line 1002 by way of the switch 610. The switch 610 may be mechanically contactable with the cam 326 (FIG. 4A) of the latch bar 300, so that the state of the switch 610 is dependent on the rotational position of the latch bar 300. The electronic circuitry on the PCB 508 may perform the at least one test in response to the switch 610 being depressed by the cam 326. The electrical circuitry on the PCB 508 may also activate the electromagnet 520 (FIG. 9) in response to a pass indication from the at least one test.

The PCB 508 is illustrated in FIG. 10 as having several individual electrical circuits to implement the above-described functions. It is noted that in other embodiments, the individual circuits may be incorporated into a single circuit or they may be implemented in software and/or firmware. In the implementation depicted in FIG. 10, a detection circuit 1020 detects the state of the switch 610. The detection circuit 1020 may initiate the at least one test to be performed by the test circuit 1022 in response to detecting a state change of the switch 610.

The test circuit 1022 may perform at least one test, which may test internal components of the electronic circuit breaker 100 and/or faults with the line 1002 and/or the load 1004 and/or the electrical neutral. For example, the test circuit 1022 may test the resistance between the load 1004 and electrical neutral to determine whether a low-resistance condition exists in the load 1004. The test circuit 1022 may test the voltage generated by the line 1002 to determine whether the voltage is within predetermined values, such as less than a maximum voltage and/or greater than a minimum voltage, or within a predetermined range. The test circuit 1022 may also perform other tests on electrical circuitry within the electronic circuit breaker 100 and other fault conditions between the line 1002 and the load 1004. Based on data received from the at least one test, the test circuit 1022 may transmit a signal to the unlock circuit 1024. For example, in response to a failure of the at least one test, the test circuit 1022 may transmit a signal to the unlock circuit 1024 indicating that the handles 110, 112 are to be locked and prevented from moving to the ON position. In response to a pass of the at least one test, the test circuit 1022 may transmit a signal to the unlock circuit 1024 causing the electromagnet 520 to activate. The activation of the electromagnet 520 moves the latch device 524 (FIG. 9) and thus unlocks the latch bar 300 and allows the user to move the handles 110, 112 to the ON position. Thus, the unlock circuit 1024 either maintains the latch device 524 in the locked position or the unlock circuit 1024 causes the latch device 524 to move to the unlocked position.

Having described components of the electronic circuit breaker 100, its mechanical operation will now be described.

Reference is made to FIGS. 11A-14E, which include various cross-sectional views of the electronic circuit breaker 100 in various states of operation, and components thereof. The references for the cross-sectional views are based on cross sections taken along the section lines A-A through D-D of the latch bar 300 as indicated in FIGS. 11E-14E.

Figure 11A:
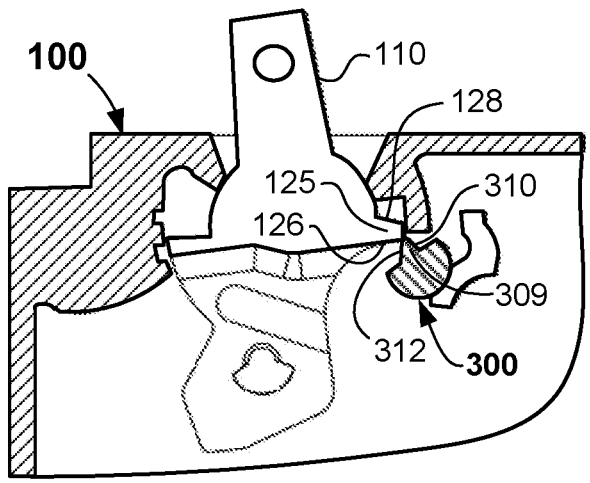
FIGS. 11A-11E illustrate several cross-sectional views of an electronic circuit breaker with a lockout subassembly therein according to embodiments, the electronic circuit breaker illustrated transitioning to an ON state after passing at least one test while in a RESET state.
Figure 11B:
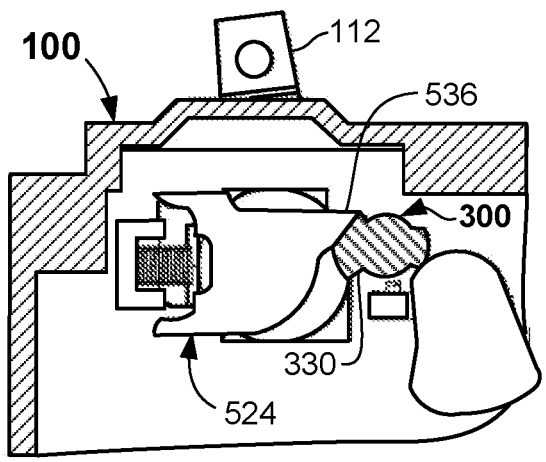
Figure 11C:
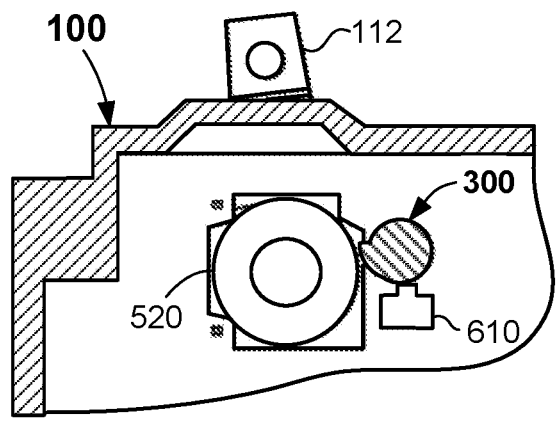
Figure 11D:
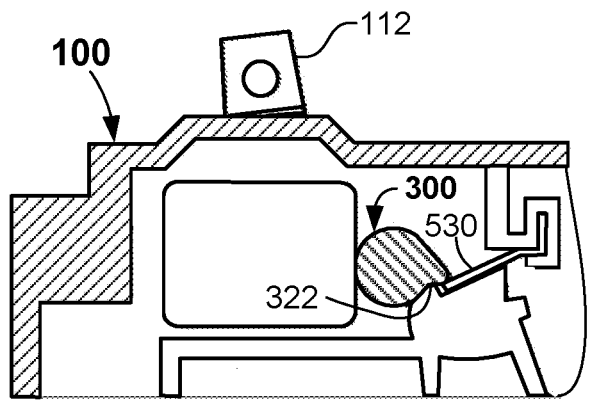
Figure 11E:
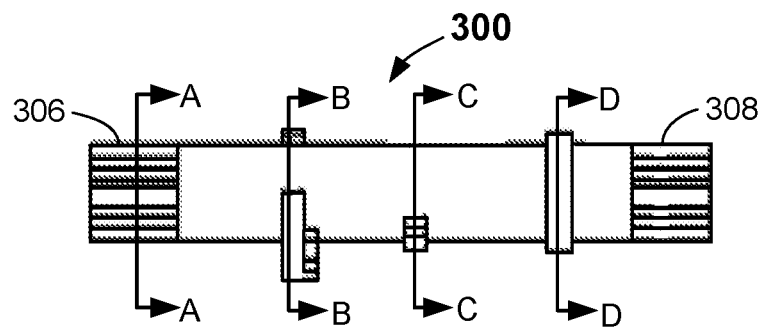

Referring to FIGS. 11A-11E, the electronic circuit breaker 100 is illustrated transitioning to the ON state after passing the at least one test. The handles 110, 112 are thus transitioning from a full clockwise position (RESET position) to a full counter-clockwise position (ON position) as viewed from FIGS. 11A-11E. The electromagnet 520 had been activated when the handles 110, 112 were previously moved to the RESET position, which released the tab 536 from the lock portion 330 (tab 536 shown pulled into the paper in FIG. 11B behind the lock portion 330) and enabled the latch bar 300 to rotate. The latch bar 300 is then rotated clockwise as viewed from FIGS. 11A-11E by the torsion spring 540 of FIG. 9. The latch bar 300 is further rotated clockwise as the second contact surface 128 contacts the second contact surface 312. As shown in FIG. 11A, the lock member 125 of the handle 110 clears the engagement portion 309 of the latch bar 300, so the handle 110 is free to rotate counter-clockwise to the ON position. As this rotation occurs the return spring 530 shown in FIG. 11D is flexed. When the lock member 125 releases contact from the engagement portion 309 as shown in FIG. 11A, the return spring 530 rotates the latch bar 300 counter-clockwise. When the handles 110, 112 are rotated to counter-clockwise to the ON position, the electrical contacts 1008 (FIG. 10) close and current may conduct between the line 1002 and the load 1004.

Figure 12A:
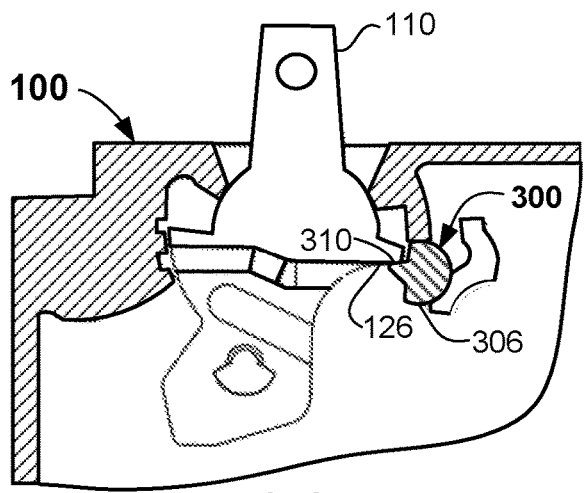
FIGS. 12A-12E illustrate several cross-sectional views of an electronic circuit breaker with a lockout subassembly therein according to embodiments, the electronic circuit breaker illustrated in a TRIP state.
Figure 12B:
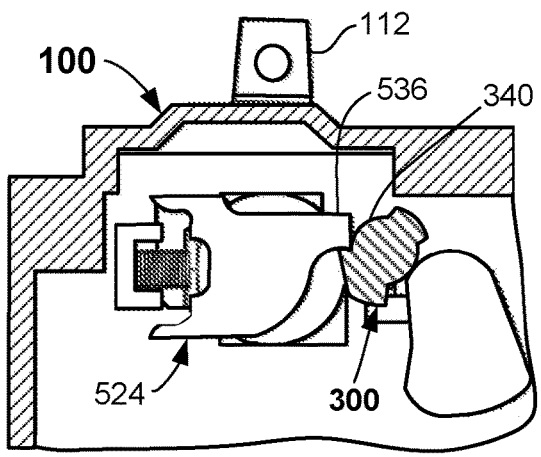
Figure 12C:
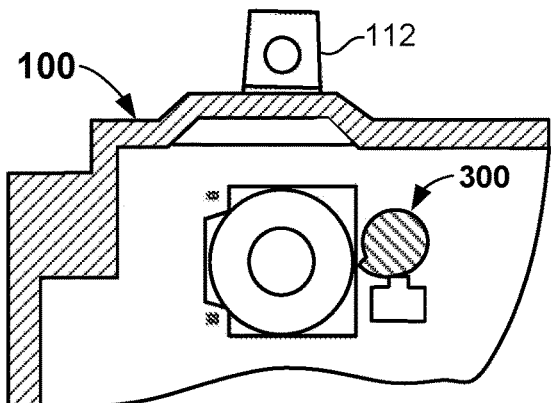
Figure 12D:
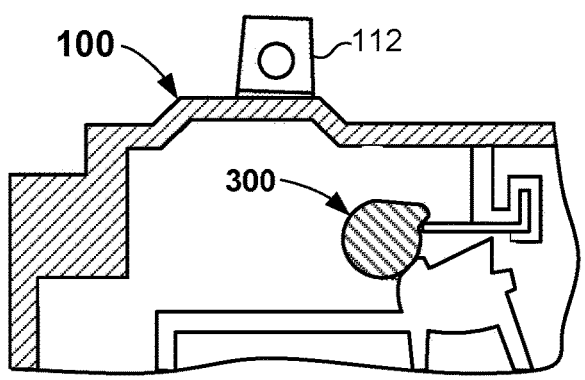
Figure 12E:
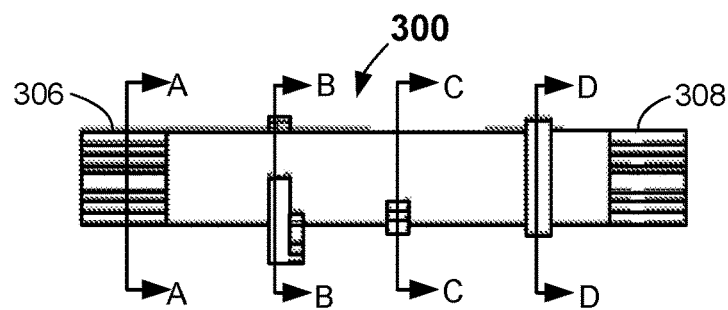

FIGS. 12A-12E illustrate several views of the electronic circuit breaker 100 in the TRIP state. During the transition to the TRIP state, the first contact surface 126 of the handle 110 contacted the first contact surface 310 of the latch bar 300 and rotated the latch bar 300 counter-clockwise as shown in FIG. 12A. The rotation of the latch bar 300 caused the gap 340 to be positioned adjacent the tab 536 of the latch device 524 as shown in FIG. 12B. The force exerted by the compression spring 532 pivoted the latch device 524 so that the tab 536 resides within the gap 340. In the TRIP state, the electrical contacts 1008 (FIG. 10) are open and the handles 110, 112 are rotated clockwise to the RESET position.

Figure 13A:
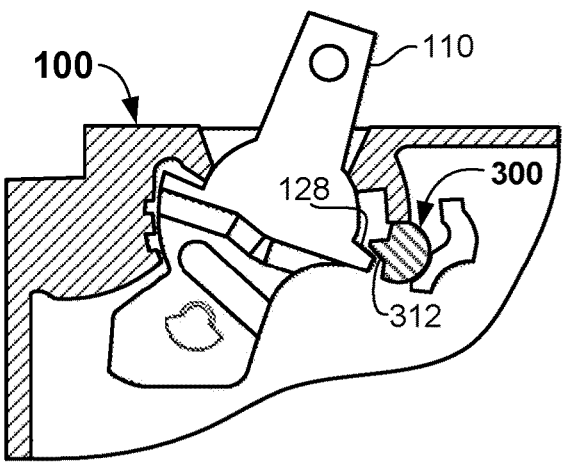
FIGS. 13A-13E illustrate several cross-sectional views of an electronic circuit breaker with a lockout subassembly therein according to embodiments, the electronic circuit breaker illustrated in an OFF state.
Figure 13B:
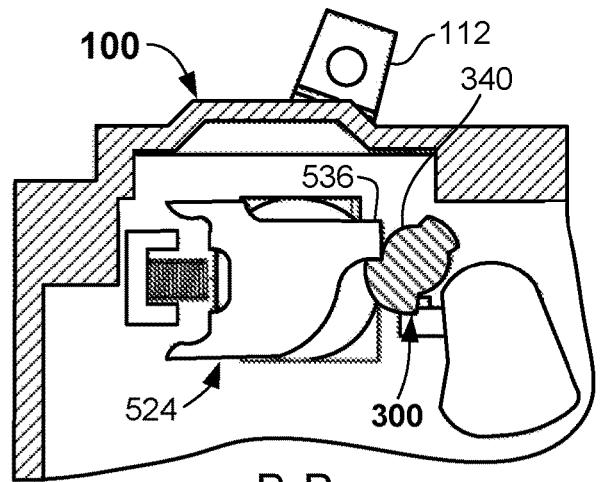
Figure 13C:
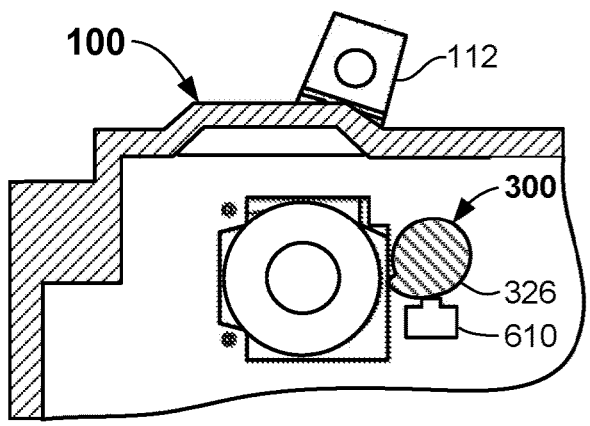
Figure 13D:
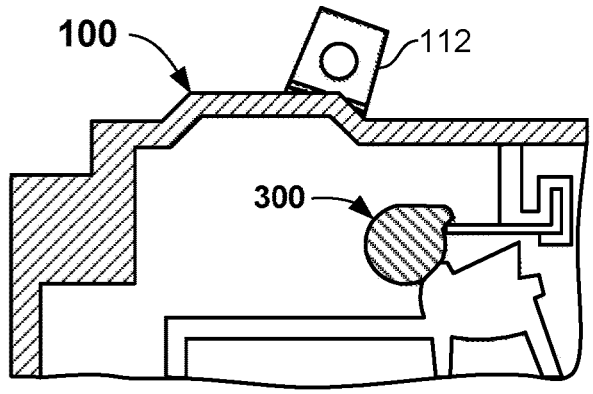
Figure 13E:
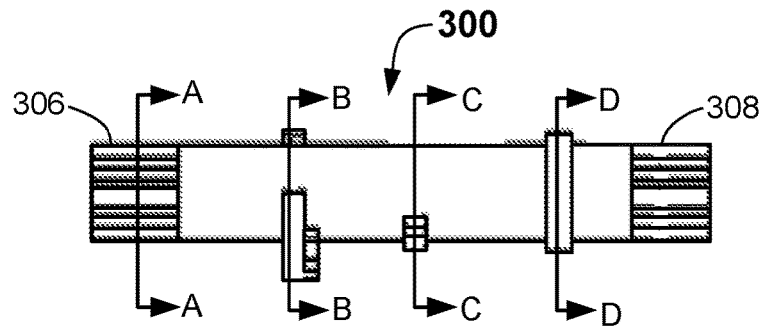

FIGS. 13A-13E illustrate the electronic circuit breaker 100 in the OFF state. The OFF state is achieved when a user moves the handles 110, 112 to the OFF position, such as to manually open the electrical contacts 1008 (FIG. 10) or when the user moves the handles 110, 112 clockwise from the TRIP position toward the RESET position. As shown in FIG. 13A, the handle 110 has moved to a position where the second contact surface 128 of the handle 110 is in contact with the second contact surface 312. Additionally, as shown in FIG. 13B, the tab 536 is received in the gap 340, which is referred to as the latch device 524 being in a locked position. Accordingly, the handles 110, 112 are prevented from rotating counter-clockwise to the ON position. Preventing the movement of the handles 110, 112 provides tactile feedback to a user that the handles 110, 112 have to be rotated to the RESET position before they can be moved to the ON position. Further, the locked position prevents the reclosing of the electrical contacts 1008 until the at least one test is passed.

Figure 14A:
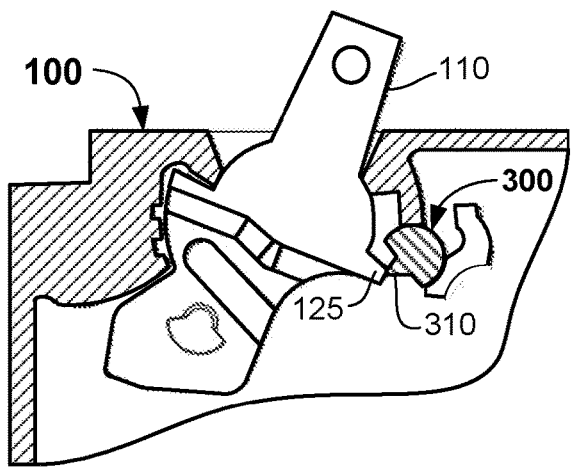
FIGS. 14A-14E illustrate several cross-sectional views of an electronic circuit breaker with a lock mechanism located therein according to embodiments, the electronic circuit breaker illustrated transitioning to an ON state after having passed at least one test while in a RESET state.
Figure 14B:
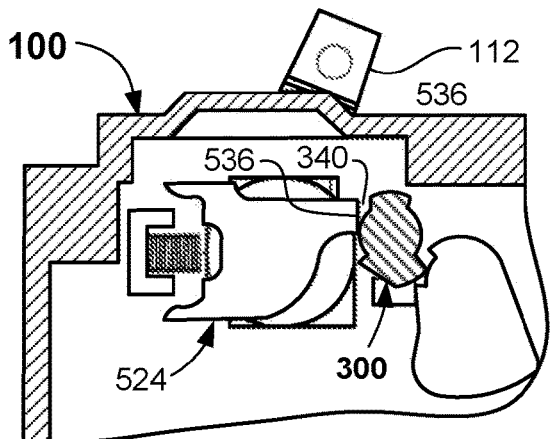
Figure 14C:
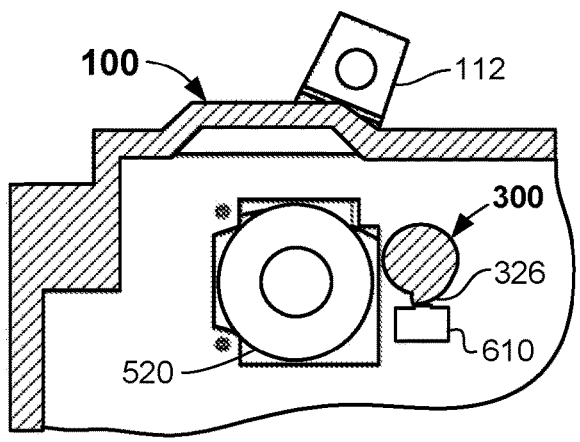
Figure 14D:
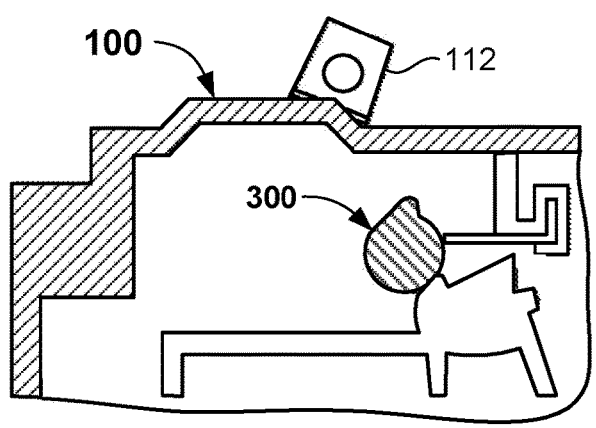
Figure 14E:
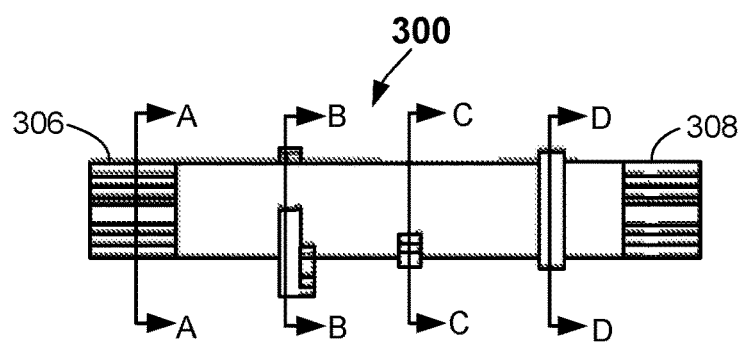

FIGS. 14A-14E illustrate several views of the electronic circuit breaker 100 after having been in the RESET state and now transitioning to the ON state after the at least one test indicated a pass. Specifically, the handles 110, 112 are positioned between the RESET position and the OFF position. As shown in FIG. 14C, the cam 326 has activated the switch 610, which initiated the at least one test. In the state of FIGS. 14A-14E, the at least one test has indicated a pass, so the electromagnet 520 has been activated. The magnetic force generated by the electromagnet 520 pivots the latch device 524, which moves and releases the tab 536 from within the gap 340. When the tab 536 is released from the gap 340, the latch device 524 is referred to as being in an unlocked state, i.e., no longer within the gap 340. With the tab 536 released from the gap 340, the latch bar 300 is free to rotate clockwise, which clears the latch bar 300 from preventing movement of the handles 110, 112. Accordingly, the handles 110, 112, upon being unlocked, are now enabled to rotate to the ON position, which closes the electrical contacts 1008 (FIG. 10). In some embodiments, the at least one test is completed within one second so as to have minimal impact on the operation of the electronic circuit breaker 100. If the at least one test indicates a fail, the rotation of the latch bar 300 is limited, which prevents the lock member 125 from clearing the engagement portion 309. In such a situation, the limited rotational movement of the latch bar 300 prevents the handles 110, 112 from moving to the ON position.

Figure 15:
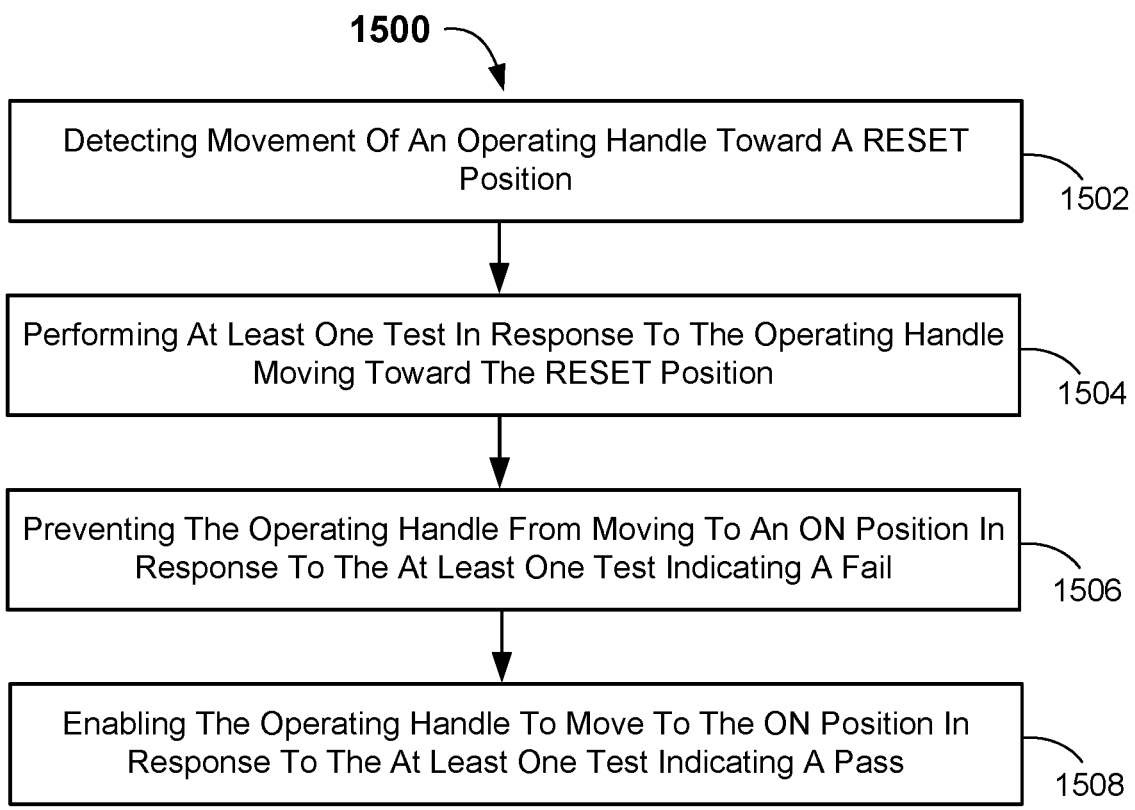
FIG. 15 illustrates a flowchart of a method of operating an electronic circuit breaker including a lockout subassembly according to embodiments.

FIG. 15 illustrates a flowchart of a method of operating an electronic circuit breaker (e.g., electronic circuit breaker 100). The method 1500 includes, in 1502, detecting movement of an operating handle (e.g., operating handle 110, 112) toward a RESET position. The detecting may be accomplished by a switch 610 that engages with a cam 326 formed on the latch bar 300, for example. Other types and locations of switches may be used.

The method 1500 further includes, in 1504, performing at least one test in response to the operating handle (e.g., operating handle 110, 112) moving toward the RESET position. The at least one test may test the electronic circuit of the electronic circuit breaker 100 for operability and/or a test of the electrical circuit protected by the electronic circuit breaker 100 for the presence of a fault condition (e.g., ground fault or arc fault).

The method 1500 may further include, in 1506, preventing the operating handle (e.g., operating handle 110, 112) from moving to an ON position in response to the at least one test indicating a fail.

The method 1500 may further include, in 1508, enabling the operating handle (e.g., operating handle 110, 112) to move to the ON position in response to the at least one test indicating a pass. The enabling may be provided by movement of the latch device 524, so that it is no longer engaged with the lock portion 330 of the latch bar 300. The movement may be caused by activation of an electromagnet 520 so that a tab 536 of the latch device 524 is removed from (i.e., slid out of) the gap 340 formed on the lock portion 330 of the latch bar 300.

The foregoing description discloses only example embodiments of the disclosure. Modifications of the above disclosed apparatus and methods which fall within the scope of the disclosure will be readily apparent to those of ordinary skill in the art. For example, the lockout subassembly may be implemented in other devices, such as manually operated switches and other types of circuit breakers.

Accordingly, while the present disclosure has been described in connection with example embodiments thereof, it should be understood that other embodiments may fall within the scope of the disclosure, as defined by the claims.

The invention claimed is:

1. A circuit breaker, comprising:
   an operating handle movable to a RESET position and to an ON position;
   electrical contacts being in a closed state in response to the operating handle being in the ON position and being in an open state in response to the operating handle being in the RESET position;
   electronic circuitry configured to perform at least one test in response to the operating handle moving to the RESET position and indicating a pass or fail of the at least one test;
   a lockout subassembly having a locked state configured to prevent the operating handle from moving to the ON position in response to the at least one test indicating a fail and having an unlocked state configured to enable the operating handle to move to the ON position in response to the at least one test indicating a pass, wherein the lockout subassembly includes:
   a rotatable latch bar having an engagement portion configured to prevent movement of the operating handle when the rotatable latch bar is positioned between a first rotational position and a second rotational position, the rotatable latch bar further including a lock portion, and
   a latch device configured to be receivable in the lock portion, wherein rotation of the rotatable latch bar is limited between the first rotational position and the second rotational position in response to the latch device being received in the lock portion; and
   a ledge, wherein the latch device is biased to contact the ledge when the latch device is received in the lock portion.

2. The circuit breaker of claim 1, further comprising an electromagnet electrically coupled to the electronic circuitry, wherein the latch device is moveable between the locked state and the unlocked state in response to the electromagnet being activated by a signal generated by the electronic circuitry.

3. The circuit breaker of claim 1, wherein the operating handle includes a lock member, wherein the engagement portion contacts the lock member in response to the lockout subassembly being in the locked state, and wherein the contact prevents the operating handle from moving to the ON position.

4. The circuit breaker of claim 1, further comprising a switch, wherein rotational movement of the rotatable latch bar to the second rotational position transitions the state of the switch, and wherein the electronic circuitry is operable to perform the at least one test in response to the transition of the state of the switch.

5. The circuit breaker of claim 1, wherein the rotatable latch bar includes a cam configured to contact a switch in response to the rotatable latch bar rotating to the second rotational position.

6. The circuit breaker of claim 1, wherein the lock portion includes a gap configured to receive at least a portion of the latch device.

7. The circuit breaker of claim 1, wherein the rotatable latch bar includes a feature having a surface configured to contact a spring, the spring configured to bias the rotational latch bar toward the first rotational position.

8. The circuit breaker of claim 7, wherein the feature is configured to at least partially retain the rotatable latch bar within a circuit breaker.

9. The circuit breaker of claim 1, further comprising a switch, wherein movement of the operating handle to the RESET position transitions the state of the switch, and wherein the electronic circuitry is operable to perform the at least one test in response to the transition of the state of the switch.

10. The circuit breaker of claim 1, wherein the electrical contacts are configured to be coupled to a circuit, and wherein the at least one test is operable to determine at least one of the following: a fault in the circuit; resistance of the circuit; and at least one voltage of the circuit.

11. A circuit breaker, comprising:
an operating handle movable to a RESET position and to an ON position;
electrical contacts being in a closed state in response to the operating handle being in the ON position and being in an open state in response to the operating handle being in the RESET position;
electronic circuitry configured to perform at least one test in response to the operating handle moving to the RESET position and indicating a pass or fail of the at least one test;
a lockout subassembly having a locked state configured to prevent the operating handle from moving to the ON position in response to the at least one test indicating a fail and having an unlocked state configured to enable the operating handle to move to the ON position in response to the at least one test indicating a pass, wherein the lockout subassembly includes:
a rotatable latch bar including a lock portion, and
a latch device configured to be receivable in the lock portion,
wherein the rotatable latch bar positions between a first rotational position and a second rotational position, and
wherein the rotatable latch bar includes a cam configured to contact a switch in response to the rotatable latch bar rotating to the second rotational position; and
a ledge, wherein the latch device is biased to contact the ledge when the latch device is received in the lock portion.

12. The circuit breaker of claim 11, further comprising an electromagnet electrically coupled to the electronic circuitry, wherein the latch device is moveable between the locked state and the unlocked state in response to the electromagnet being activated by a signal generated by the electronic circuitry.

13. The circuit breaker of claim 11, further comprising a switch, wherein rotational movement of the rotatable latch bar to the second rotational position transitions the state of the switch, and wherein the electronic circuitry is operable to perform the at least one test in response to the transition of the state of the switch.

14. The circuit breaker of claim 11, wherein the lock portion includes a gap configured to receive at least a portion of the latch device.

15. The circuit breaker of claim 11, wherein the rotatable latch bar includes a feature having a surface configured to contact a spring, the spring configured to bias the rotational latch bar toward the first rotational position, wherein the feature is configured to at least partially retain the rotatable latch bar within a circuit breaker.

16. A circuit breaker, comprising:
an operating handle movable to a RESET position and to an ON position;
electrical contacts being in a closed state in response to the operating handle being in the ON position and being in an open state in response to the operating handle being in the RESET position;
electronic circuitry configured to perform at least one test in response to the operating handle moving to the RESET position and indicating a pass or fail of the at least one test;
a lockout subassembly having a locked state configured to prevent the operating handle from moving to the ON position in response to the at least one test indicating a fail and having an unlocked state configured to enable the operating handle to move to the ON position in response to the at least one test indicating a pass, wherein the lockout subassembly includes:
a rotatable latch bar including a lock portion, and
a latch device configured to be receivable in the lock portion,
wherein the rotatable latch bar positions between a first rotational position and a second rotational position, and
wherein the lock portion includes a gap configured to receive at least a portion of the latch device; and
a ledge, wherein the latch device is biased to contact the ledge when the latch device is received in the lock portion.

17. The circuit breaker of claim 16, further comprising an electromagnet electrically coupled to the electronic circuitry, wherein the latch device is moveable between the locked state and the unlocked state in response to the electromagnet being activated by a signal generated by the electronic circuitry.

18. The circuit breaker of claim 16, further comprising a switch, wherein rotational movement of the rotatable latch bar to the second rotational position transitions the state of the switch, and wherein the electronic circuitry is operable to perform the at least one test in response to the transition of the state of the switch.

19. The circuit breaker of claim 16, wherein the lock portion includes a gap configured to receive at least a portion of the latch device.

20. The circuit breaker of claim 16, wherein the rotatable latch bar includes a feature having a surface configured to contact a spring, the spring configured to bias the rotational latch bar toward the first rotational position, wherein the feature is configured to at least partially retain the rotatable latch bar within a circuit breaker.

* * * * *